US007123664B2

(12) United States Patent  
Matero

(10) Patent No.: US 7,123,664 B2  
(45) Date of Patent: Oct. 17, 2006

(54) MULTI-MODE ENVELOPE RESTORATION ARCHITECTURE FOR RF TRANSMITTERS

(75) Inventor: Jorma Matero, Oulu (FI)

(73) Assignee: Nokia Corporation, Espoo (FI)

( * ) Notice: Subject to any disclaimer, the term of this patent is extended or adjusted under 35 U.S.C. 154(b) by 767 days.

(21) Appl. No.: 10/246,574

(22) Filed: Sep. 17, 2002

(65) Prior Publication Data

US 2004/0052312 A1    Mar. 18, 2004

(51) Int. Cl.
   *H04L 27/04*    (2006.01)
   *H03F 3/38*    (2006.01)
(52) U.S. Cl. .................. 375/295; 375/219; 375/297; 330/10
(58) Field of Classification Search ................ 375/296, 375/297, 295, 219; 330/151, 149, 52, 124 R, 330/302, 53, 136, 10, 207 A, 251, 297; 455/127.1, 455/127.2, 114.1, 114.3, 126, 127.3, 522, 455/91, 108, 115.1; 333/216, 213, 214, 32
See application file for complete search history.

(56) References Cited

U.S. PATENT DOCUMENTS

| | | | |
|---|---|---|---|
| 6,084,468 A * | 7/2000 | Sigmon et al. ............. | 330/136 |
| 6,141,541 A * | 10/2000 | Midya et al. ................. | 455/91 |
| 6,256,482 B1 | 7/2001 | Raab ......................... | 455/108 |
| 6,377,784 B1 | 4/2002 | McCune ...................... | 455/108 |
| 6,404,823 B1 * | 6/2002 | Grange et al. .............. | 375/297 |
| 6,552,634 B1 * | 4/2003 | Raab .......................... | 333/216 |
| 6,681,101 B1 * | 1/2004 | Eidson et al. ............ | 455/127.1 |
| 6,683,495 B1 * | 1/2004 | Johnson et al. ............... | 330/52 |
| 6,819,720 B1 * | 11/2004 | Willetts ....................... | 375/296 |
| 6,934,341 B1 * | 8/2005 | Sahlman ..................... | 375/297 |
| 2002/0079960 A1 * | 6/2002 | Myers et al. ................. | 330/10 |
| 2002/0160804 A1 * | 10/2002 | Bogner et al. .............. | 455/522 |
| 2003/0112063 A1 * | 6/2003 | Kenington ................... | 330/10 |
| 2003/0114124 A1 * | 6/2003 | Higuchi ...................... | 455/126 |

OTHER PUBLICATIONS

An ultra-broadband power amplifier using dynamically-controlled linearisation Kenington, P.B. et al; Microwave Symposium Digest, 1999 IEEE MTT-S InternationalVolume 1, Jun. 13-19, 1999 pp.: 355-358 vol. 1.*
L-band transmitter using Kahn EER technique Raab, F.H. et al; Microwave Theory and Techniques, IEEE Transactions on vol. 46, Issue 12, Part 2, Dec. 1998 pp.: 2220-2225.*
Drive modulation in Kahn-technique transmitters Raab, F.H.; Microwave Symposium Digest, 1999 IEEE MTT-S International vol. 2, Jun. 13-19, 1999 pp.: 811-814 vol.2.*

* cited by examiner

*Primary Examiner*—Temesghen Ghebretinsae
(74) *Attorney, Agent, or Firm*—Ware, Fressola, Van Der Sluys & Adolphson LLP

(57) ABSTRACT

An RF transceiver having dual-mode envelope restoration architecture. In narrow-band applications such as GSM/EDGE, a switch-mode amplifier is used to provide an envelope signal for amplitude modulating the phase-modulated signals. To achieve required modulation bandwidth in wide-band applications such as WDCMA, an analog amplifier is used to provide the envelope signal. Furthermore, in the wide-band mode, the envelope modulation is applied through the base of an emitter follower while the collector voltage is scaled to achieve a desired power output in the amplitude-modulated signals.

18 Claims, 3 Drawing Sheets

MULTI-MODE ENVELOPE RESTORATION ARCHITECTURE FOR RF TRANSMITTERS

FIELD OF THE INVENTION

The present invention is related generally to radio-frequency transmitters and, more specifically, to envelope restoration transmitters.

BACKGROUND OF THE INVENTION

Envelope elimination and restoration (EER) principle is known in the art. For example, Raab (U.S. Pat. No. 6,256,482 B1) discloses a power-conserving drive-modulation method for EER transmitter, wherein an envelope baseband component and a phase modulation (PM) radio-frequency (RF) component of a modulated signal are separately amplified and then combined in a signal for transmission. The major advantage of the EER transmitter is that the RF PM signal is amplified by highly efficient nonlinear RF amplifiers and the last RF amplifier is amplitude-modulated by the envelope signal, thereby restoring the modulation at the output of the transmitter. In Raab, the envelope and phase components are separated by analog means using a limiter for removing the envelope component such that only the PM component is present at the limiter output and an envelope detector is used to detect the baseband component from the original modulated RF waveform. The envelope and phase components can also be generated by a digital signal processor (DSP), which gives better performance over the analog counterpart. As shown in FIG. 1, the envelope component is generated by an envelope modulation module 12 in the DSP and D/A converted. After frequency filtering by a low-pass filter F1, the envelope component is changed into a pulse-width modulation (PWM) format in a PWM modulator, which feeds a switch-mode class-D or class-S amplifier A1. The digital PWM signal from the amplifier A1 is converted into an analog signal by a low-pass filter F3. The switch-mode amplifier has higher efficiency than traditional analog amplifiers. The phase component directly modulates a frequency synthesizer (PLL, F2, VCO). After being amplified by a driver A2, the phase component is amplitude-modulated in a class-E power amplifier A3.

Alternatively, when the modulation bandwidth is high and the required PWM frequency is high, which increases losses in the switching transistors, it is advantageous to use an analog amplifier A4 to provide the envelope waveform for amplitude modulation, as shown in FIG. 2.

High-efficiency RF modulation can also be found in McCune (U.S. Pat. No. 6,377,784), which discloses a method of reducing the spread between a maximum frequency of a desired modulation and the operating frequency of a switch-mode DC-DC converter.

Switch-mode envelope modulation is within the limits of present technology of EDGE (Enhanced Data Rates for GSM Evolution). However, the efficiency of switch-mode envelope modulation for use in WCDMA (Wideband Code-Division Multiple Access) is poor due to the high switching frequency needed to achieve required modulation bandwidth in WCDMA. Thus, it is advantageous and desirable to provide an envelope restoration transmitter, which is capable of efficiently transmitting signals in the GSM/EDGE mode as well as in the WCDMA mode.

SUMMARY OF THE INVENTION

According to the first aspect of the present invention, there is provided a transmitter for transmitting information in a modulated signal at least in a first carrier frequency band or a second, different carrier frequency band. The transmitter is characterized by a signal processor for providing baseband data indicative of the information, by means, responsive to the baseband data, for providing an envelope waveform indicative of an envelope of the modulated signal, by a phase modulating mechanism for providing a first signal in the first carrier frequency band and a second signal in the second carrier frequency band, by a first amplification device, responsive to the envelope waveform and the first signal, for providing the modulated signal in the first carrier frequency band, by a second amplification device, responsive to the envelope waveform and the second signal, for providing the modulated signal in the second carrier frequency band, and by a band selection means for selecting at least between the modulated signal in the first carrier frequency band and the modulated signal in the second carrier frequency band for transmission, wherein the first and second signals are phase-modulated radio-frequency signals, and the first carrier frequency band comprises a first range of radio-frequencies and the second carrier frequency band comprises a second range of radio-frequencies lower than the first range.

Advantageously, the baseband data is provided in a digital form, and the envelope waveform providing means comprises a pulse width modulator for providing the envelope waveform for amplitude-modulating the second signal.

Advantageously, the baseband data is provided in a digital form; and the envelope waveform providing means comprises a digital-to-analog converter for providing the envelope waveform for amplitude-modulating the first signal.

Advantageously, the envelope waveform comprises a first waveform component and a second waveform component, wherein the pulse width modulator provides the second waveform component for amplitude-modulating the second signal, and the digital-to-analog converter provides the first waveform component for amplitude-modulating the first signal.

Preferably, the transmitter further characterized by an emitter-follower device (T1) having a collector, an emitter and a base, wherein the second waveform component is provided to the collector of the emitter-follower device, and the first waveform component is provided to the base of the emitter-follower device, so as to provide an envelope voltage at the emitter for amplitude-modulating the first signal.

Advantageously, the transmitter is further characterized by a power control device for controlling power of the first and second amplification devices.

Advantageously, the second waveform component is scalable so as to achieve a desired output power in the first carrier frequency band.

According to the second aspect of the present invention, there is provided a method of envelope restoration for information transmission in a modulated signal at least in a first carrier frequency band or in a second different carrier frequency band. The method is characterized by providing baseband data indicative of the information, by providing an envelope waveform indicative of an envelope of the modulated signal based on the baseband data, by providing a first phase modulated signal in the first carrier frequency band and a second phase modulated signal in the second carrier frequency band, by providing a first amplitude-modulated signal in the first carrier frequency band based on the envelope waveform and the first phase modulated signal and a second amplitude-modulated signal in the second carrier frequency band based on the envelope waveform and the second phase modulated signal, and by selecting between the first amplitude-modulated signal and the second amplitude-modulated signal for transmission.

Advantageously, the baseband data is provided in a digital form, and the envelope waveform comprises:

a first waveform component provided by a digital-to-analog converter for amplitude-modulating the first phase modulated signal for providing the first amplitude-modulated signal, and a second waveform component provided by a pulse width modulator for amplitude-modulating the second phase modulated signal for providing the second amplitude modulated signal.

Preferably, the envelope waveform comprises a first waveform component provided by a digital-to-analog converter, and a second waveform component provided by a pulse width modulator. The method is further characterized by an emitter follower device having a collector, an emitter and a base, wherein the second waveform component is provided to the collector of the emitter-follower device, and the first waveform component is provided to the base of the emitter-follower device, so as to provide an envelope voltage at the emitter of the emitter-follower device for amplitude-modulating the first phase modulated signal for providing the first amplitude-modulated signal.

Advantageously, the second waveform component is scalable so as to achieve a desired output power in the first amplitude-modulated signal.

According to the third aspect of the present invention, there is provided a transceiver, adapted to operate at least in a first carrier frequency band or in a second, different carrier band. The transceiver comprises:

an antenna, a transmitter operatively connected to the antenna for transmitting signals, and a receiver operatively connected to the antenna for receiving signals, characterized in that the transmitter comprises:

a signal processor for providing baseband data indicative of the information, by means, responsive to the baseband data, for providing an envelope waveform indicative of an envelope of the modulated signal, by a phase modulating mechanism for providing a first signal in the first carrier frequency band and a second signal in the second carrier frequency band, by a first amplification device, responsive to the envelope waveform and the first signal, for providing the modulated signal in the first carrier frequency band, by a second amplification device, responsive to the envelope waveform and the second signal, for providing the modulated signal in the second carrier frequency band, and by a band selection means for selecting at least between the modulated signal in the first carrier frequency band and the modulated signal in the second carrier frequency band for transmission.

The present invention will become apparent upon reading the description taken in conjunction with FIG. 3.

BEST MODE TO CARRY OUT THE INVENTION

Figure 1:
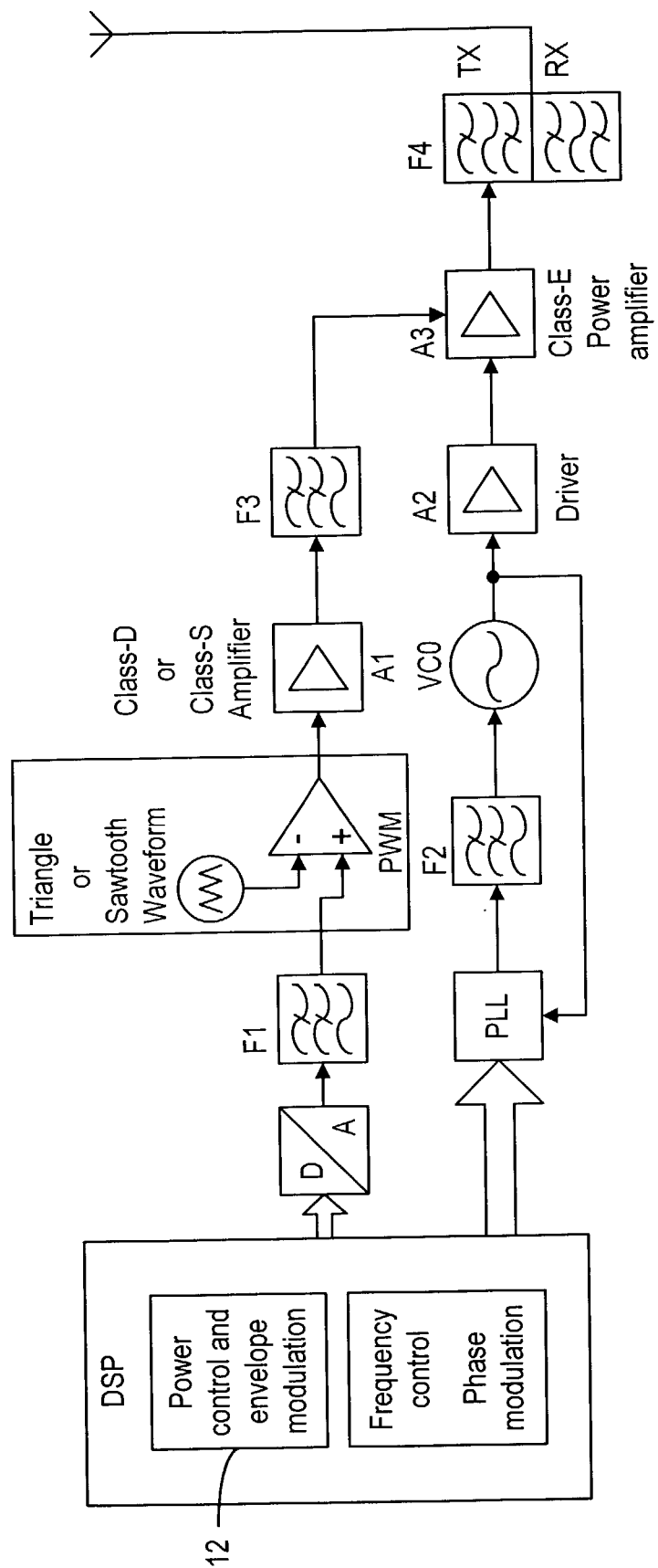
FIG. 1 is a block diagram showing a prior art envelope restoration transmitter.
Figure 2:
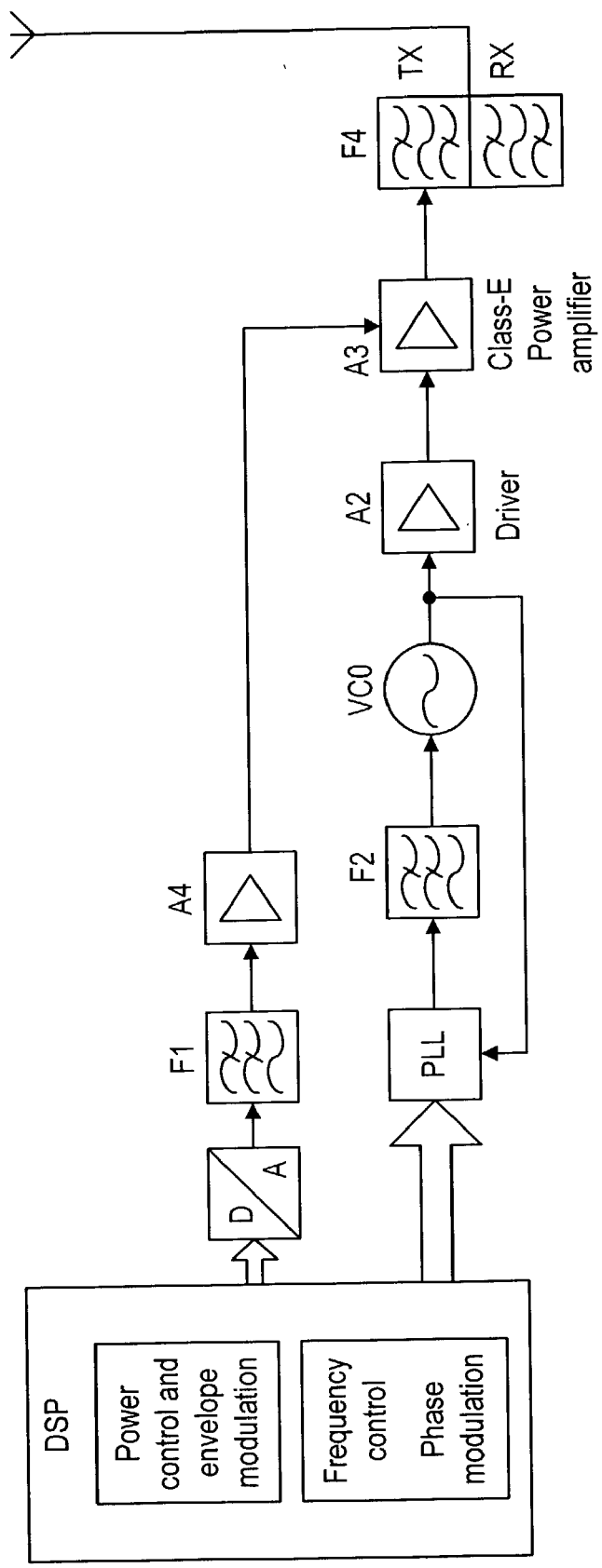
FIG. 2 is a block diagram showing another prior art envelope restoration transmitter.
Figure 3:
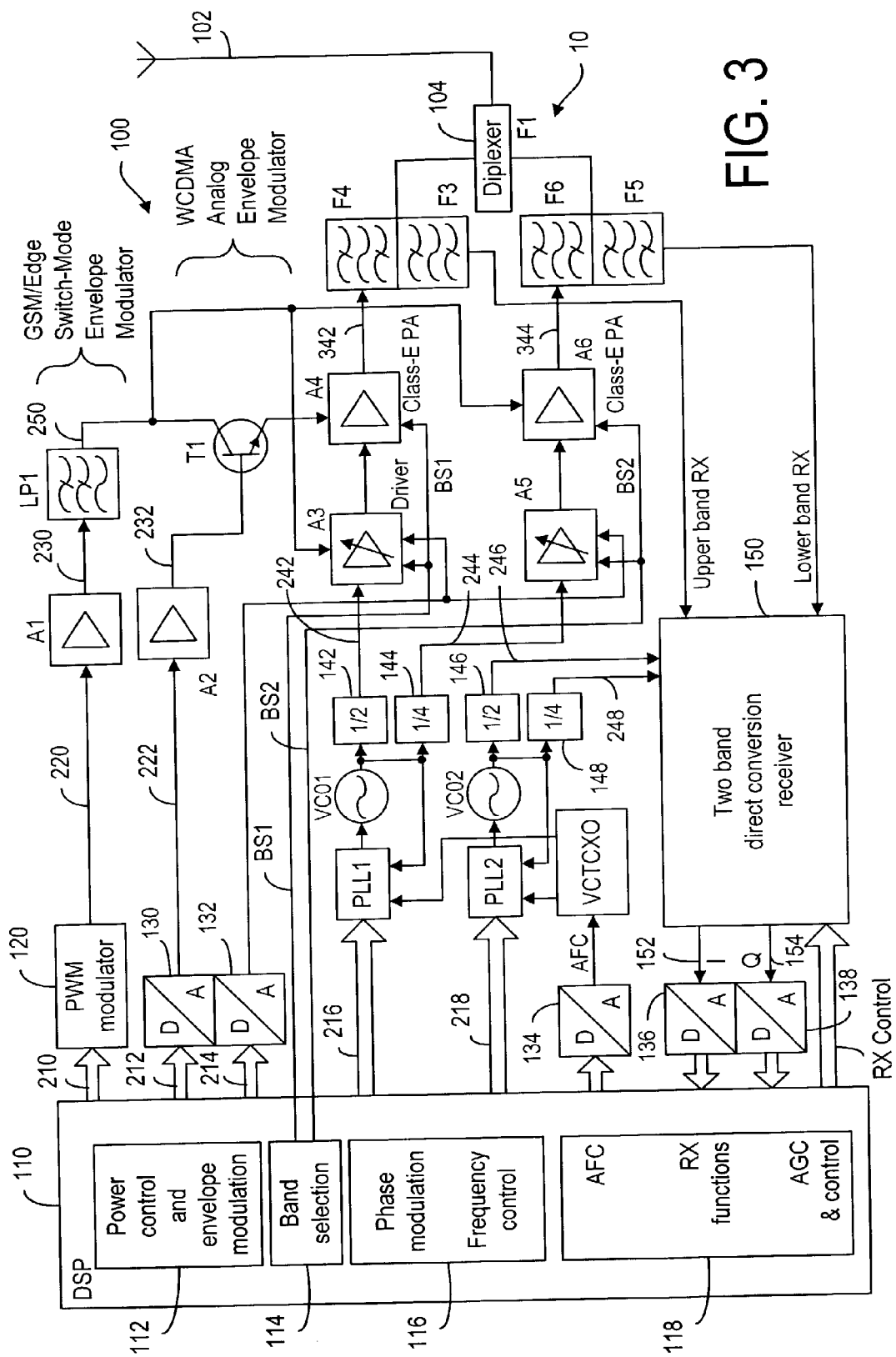
FIG. 3 is a block diagram showing the multi-mode, dual-band envelope restoration transceiver.

FIG. 3 shows a dual-band architecture for a multi-mode envelope restoration transceiver 10, which comprises a transmitter 100. The transceiver 10 has a common antenna 102 for transmitting signals and receiving signals. The common antenna 102 is split to two different frequency bands by a diplexer 104. Transmitter carrier signal is generated within a synthesizer PLL1/VCO1. The output frequency of the synthesizer is divided by 2 by a frequency divider 142 for an upper band (approximately 1900 MHz) and by 4 by a frequency divider 144 for a lower band (approximately 900 MHz). The lower band can be used for a GSM (Global System for Mobile Communications) or EDGE (Enhanced Data Rates for GSM Evolution) mode, while the upper band can be used for a WCDMA mode, for example. As in a prior art envelope restoration transmitter, the modulated signal is divided into an envelope baseband component and a phase modulated radio-frequency (PM RF) component. The PM component 216 is generated by a phase modulation module 116 in a digital signal processor (DSP) 110. The phase modulation signal 216 is applied to the synthesizer PLL1/VCO1. Same control bus as for phase modulation 216 is also used for synthesizer operation frequency programming. For lower band operations, PM modulated RF signal 244 from the frequency divider 144 is fed into an amplifier A5 and further to an amplifier A6, and the amplified signal 344 is conveyed to the transmitter part of a duplexer (F6/F5) and the diplexer 104 to the antenna 102. For the upper band, the PM modulated RF signal 242 is fed to an amplifier A3 and further to an amplifier A4, and the amplified signal 342 is conveyed to the transmitter part of a duplexer (F4/F3) and the diplexer 104 to the antenna 102. Envelope is restored in amplifier A4 or amplifier A6, where restoration is carried out by applying variable supply voltage (modulation envelope) to these class-E amplifiers A4, A6.

The envelope modulation component 210 is generated by a power control and an envelope modulation module 112 in the DSP 110. In EDGE mode (lower band), the envelope modulation component 210 is fed into a pulse width modulator (PWM) 120. Digital PWM signal 220 is fed into a switch-mode amplifier A1 operating either in class-D or class-S. Amplified digital pulses 230 are low-pass filtered in a low-pass filter LP1, which produces analog envelope voltage 250. The analog envelope voltage 250 is directly fed to a class-E amplifier A6 in the lower band operation. In GSM mode, however, the envelope is fixed and depends on desired output power.

WCDMA modulation is used in the upper band. For WCDMA modulation, the envelope modulation component 212 generated by the DSP 110 is fed to a digital-to-analog converter 130, which feeds an analog control signal 222 to an analog buffer amplifier A2. The amplified envelope signal 232 is fed to the base of a transistor T1, which is an emitter follower. The emitter of the transistor T1 feeds the envelope voltage to the supply voltage pin of a class-E RF amplifier A4 and thus restores the envelope to the PM signal that is amplified within the amplifier A4. At the same time, the switch-mode envelope modulator (120-A1-LP1) is acting as a switch-mode voltage regulator, feeding collector voltage 250 for transistor T1. The collector voltage of the transistor T1 varies according to the desired output power. Thus, it is advantageous to keep this as low as possible within the limit of the linear operation of the transistor T1. In the arrangement as shown, the collector voltage over T1 is minimized for all WCDMA power levels. Advantageously, when the voltage over T1 is minimized, the power loss of the analog envelope modulator output stage T1 is minimized. In contrast, if T1 uses a constant battery voltage for its collector, the efficiency of the analog envelope modulator would fall very rapidly for lower power levels.

The transmitter band of operation is selected by a band selection module 114 using signals BS1, BS2, which enable the desired transmitter block. Amplifiers A3, A5 are used to provide drive signals on an appropriate level for the corresponding class-E amplifiers A4, A6. On low transmit power levels, it is advantageous to reduce the drive signal level in order to reduce PM-modulated RF signal feed-through via amplifiers A4 and A6. As shown in FIG. 3, a digital-to-analog converter 132 is used to change the input drive according to the desired output power based on digital signals 214 provided by the power control and envelope modulation module 112. If the same RF drive level is used for all output power levels, the PM-modulated RF signal feed-through would be too high on low power levels and thus reduce the dynamic range of the amplitude modulated class-E amplifiers. In the upper band WCDMA operation, driver A3 also gets its supply voltage from the switch-mode modulator (120-A1-LP1), which reduces current consumption of the driver A3.

The receiver section of the transceiver 10 consists of a two-band direct conversion receiver 150. Front-end filters for the upper and lower bands are F3 and F5. Local oscillator signal is generated within synthesizer PLL2/VCO2 based on frequency control signal 218 provided by the phase modulation and frequency control module 116. Depending on the selected frequency band, the output signal from VCO2 is divided either by 2 by a frequency divider 146 or by 4 by a frequency divider 148. Divider outputs 246, 248 provide phased LO signals for the receiver I and Q mixers. The receiver 150 has common baseband I and Q filters/amplifiers (not shown). Filter corner frequency is changed according to the received signal modulation (GSM/EDGE or WCDMA). Advantageously, baseband amplifiers in the receiver 150 also contain an automatic gain control (AGC) function. The receiver I and Q signals 152, 154, after being analog-to-digital converted by corresponding converters 136 and 138, are processed by a module 118 in the DSP, which also provides an AGC function and an automatic frequency control (AFC) function. Digital-to-analog converted AFC signal from D/A converter 134 is fed to a voltage controlled temperature compensated crystal oscillator (VCTCXO), which acts as a common reference for the synthesizers (PLL1/VCO1, PLL2/VCO2).

It should be noted that in the transceiver 10, as illustrated in FIG. 3, the EDGE modulation is associated with the lower band. However, if EDGE modulation is needed on the upper band, envelope modulation can be generated either using the analog modulator T1 (with variable supply voltage generated by A1-LP1) or the switch-mode modulator A1-LP1 (with transistor T1 being driven into saturation by the D/A converter 130.

The present invention can be applied to transceivers having three or more frequency bands such that each frequency band may have its own synthesizer PLL/VCO. Alternatively, two or more bands share a common synthesizer with each band having a different frequency divider. Furthermore, in the transceiver 10, as illustrated in FIG. 3, the output of the transmitter VCO1 is frequency divided by 2 for the upper band operation and by 4 for the lower band operation. However, the output frequency of the transmitter VCO1 can be directly used for the upper band and divided by 2 for the lower band. This arrangement would reduce the current consumption. However, the VCO pulling problem will be worse on the upper band due to its own transmit signal. The arrangement in which the envelope signal is fed to the base of transistor T1 while the switch-mode envelope modulator 120-A1-LP1 acts as a switch-mode voltage regulator feeding collector voltage for T1, can also be used in a transceiver having only one band. The advantage of using this arrangement is that the power losses of the analog envelope modulator 130-A2 can be minimized when the voltage over T1 is minimized.

The tranceiver of the present invention has been described as having a lower band and an upper band. It should be understood that in the tranceiver with a dual-mode envelope restoration architecture, according to the present invention, the switch-mode amplifier is used generally to provide an envelope signal for narrow-band applications while the analog amplifier is generally used to provide the envelope signal for wide-band applications. Accordingly, in the wide-band application, the envelope modulation is applied through the base of the emitter follower (T1) while the collector voltage is scaled to achieve a desired power output in the amplitude-modulated signals.

Although the invention has been described with respect to a preferred embodiment thereof, it will be understood by those skilled in the art that the foregoing and various other changes, omissions and deviations in the form and detail thereof may be made without departing from the scope of this invention.

What is claimed is:

1. A transmitter for transmitting information in a modulated signal at least in a first carrier frequency band or a second, different carrier frequency band, said transmitter comprising:

a signal processor for providing baseband data indicative of the information, an envelope waveform providing module, responsive to the baseband data, for providing an envelope waveform indicative of an envelope of the modulated signal, by a phase modulating mechanism for providing a first signal in the first carrier frequency band and a second signal in the second carrier frequency band, a first amplification device, responsive to the envelope waveform and the first signal, for providing the modulated signal in the first carrier frequency band, a second amplification device, responsive to the envelope waveform and the second signal, for providing the modulated signal in the second carrier frequency band, and a band selection mechanism for selecting at least between the modulated signal in the first carrier frequency band and the modulated signal in the second carrier frequency band for transmission.

2. The transmitter of claim 1, wherein the first and second signals are phase modulated radio-frequency signals.

3. The transmitter of claim 2, wherein
the first carrier frequency band comprises a first range of radio frequencies and the second carrier frequency band comprises a second range of radio frequencies lower than the first range,
the baseband data is provided in a digital form, and
the envelope waveform providing module comprises a pulse width modulator for providing the envelope waveform for amplitude-modulating the second signal.

4. The transmitter of claim 2, wherein
the first carrier frequency band comprises a first range of radio frequencies and the second carrier frequency band comprises a second range of radio frequencies lower than the first range, and wherein
the baseband data is provided in a digital form, and that
the envelope waveform providing module comprises a digital-to-analog converter for providing the envelope waveform for amplitude-modulating the first signal.

5. The transmitter of claim 4, wherein the envelope waveform providing module further comprises a pulse width modulator for providing the envelope waveform for amplitude-modulating the second signal.

6. The transmitter of claim 5, wherein the envelope waveform comprises a first waveform component and a second waveform component, wherein the pulse width modulator provides the second waveform component for amplitude-modulating the second signal.

7. The transmitter of claim 5, wherein the envelope waveform comprises a first waveform component and a second waveform component, wherein the digital-to-analog converter provides the first waveform component for amplitude-modulating the first signal.

8. The transmitter of claim 5, wherein the envelope waveform comprises a first waveform component and a second waveform component, and wherein
the digital-to-analog converter provides the first waveform component, and
the pulse width modulator provides the second waveform component, said transmitter further comprising:
an emitter-follower device having a collector, an emitter and a base, wherein
the second waveform component is provided to the collector of the emitter-follower device, and
the first waveform component is provided to the base of the emitter-follower device, so as to provide an envelope voltage at the emitter of the emitter-follower device for amplitude-modulating the first signal.

9. The transmitter of claim 8, wherein the second waveform component is scalable so as to achieve a desired output power in the modulated signal in the first carrier frequency band.

10. The transmitter of claim 1, further comprising:
a power control mechanism for controlling power of the first and second amplification devices.

11. The transmitter of claim 3, wherein the first carrier frequency band comprises a frequency band substantially at 1900 MHz.

12. The transmitter of claim 3, wherein the second carrier frequency band comprises a frequency band substantially at 900 MHz.

13. The transmitter of claim 3, wherein the first carrier frequency band comprises a frequency band substantially at 1900 MHZ for wideband code-division multiple access applications, and the second carrier frequency band comprises a frequency band substantially at 900 MHz for GSM applications.

14. A method of envelope restoration for information transmission in a modulated signal at least in a first carrier frequency band or in a second different carrier frequency band, said method comprising:
providing baseband data indicative of the information,
providing an envelope waveform indicative of an envelope of the modulated signal based on the baseband data,
providing a first phase modulated signal in the first carrier frequency band and a second phase modulated signal in the second carrier frequency band,
providing a first amplitude-modulated signal in the first carrier frequency band based on the envelope waveform and the first phase modulated signal and a second amplitude-modulated signal in the second carrier frequency band based on the envelope waveform and the second phase modulated signal, and
selecting between the first amplitude-modulated signal and the second amplitude-modulated signal for transmission.

15. The method of claim 14, wherein
the baseband data is provided in a digital form, and wherein
the envelope waveform comprises:
a first waveform component provided by a digital-to-analog converter for amplitude-modulating the first phase modulated signal for providing the first amplitude-modulated signal, and
a second waveform component provided by a pulse width modulator for amplitude-modulating the second phase modulated signal for providing the second amplitude modulated signal.

16. The method of claim 14, wherein
the baseband data is provided in a digital form, and wherein
the envelope waveform comprises a first waveform component provided by a digital-to-analog converter, and a second waveform component provided by a pulse width modulator, said method further comprising:
an emitter follower device having a collector, an emitter and a base, wherein the second waveform component is provided to the collector of the emitter-follower device, and the first waveform component is provided to the base of the emitter-follower device, so as to provide an envelope voltage at the emitter of the emitter-follower device for amplitude-modulating the first phase modulated signal for providing the first amplitude-modulated signal.

17. The method of claim 16, wherein the second waveform component is scalable so as to achieve a desired output power in the first amplitude-modulated signal.

18. A transceiver adapted to operate at least in a first carrier frequency band or in a second, different carrier band, comprising:
an antenna,
a transmitter operatively connected to the antenna for transmitting signals, and
a receiver operatively connected to the antenna for receiving signals, wherein the transmitter comprises:
a signal processor for providing baseband data indicative of the information,
a further processor, responsive to the baseband data, for providing an envelope waveform indicative of an envelope of a modulated signal,
a phase modulating mechanism for providing a first signal in the first carrier frequency band and a second signal in the second carrier frequency band, a first amplification device, responsive to the envelope waveform and the first signal, for providing the modulated signal in the first carrier frequency band, a second amplification device, responsive to the envelope waveform and the second signal, for providing the modulated signal in the second carrier frequency band, and a band selection mechanism for selecting at least between the modulated signal in the first carrier frequency band and the modulated signal in the second carrier frequency band for transmission.

* * * * *

UNITED STATES PATENT AND TRADEMARK OFFICE
CERTIFICATE OF CORRECTION

| | | |
|---|---|---|
| PATENT NO. | : 7,123,664 B2 | Page 1 of 1 |
| APPLICATION NO. | : 10/246574 | |
| DATED | : October 17, 2006 | |
| INVENTOR(S) | : Jorma Matero | |

It is certified that error appears in the above-identified patent and that said Letters Patent is hereby corrected as shown below:

Column 6, line 51, which is claim 1, line 9, "by" should be deleted.

Signed and Sealed this

Twenty-seventh Day of March, 2007

JON W. DUDAS
*Director of the United States Patent and Trademark Office*